Jan. 2 1968 H. O. WOLCOTT 3,361,981

ULTRA-LINEAR D.C. AMPLIFIER

Filed March 25, 1964

INVENTOR.
HENRY O. WOLCOTT

BY Harry R. Lubcke

AGENT

United States Patent Office 3,361,981
Patented Jan. 2, 1968

3,361,981
ULTRA-LINEAR D.C. AMPLIFIER

Henry O. Wolcott, Chatsworth, Calif., assignor to Optimation, Inc., Sun Valley, Calif., a corporation of California Filed Mar. 25, 1964, Ser. No. 354,708
7 Claims. (Cl. 330—3)

Figure 1:
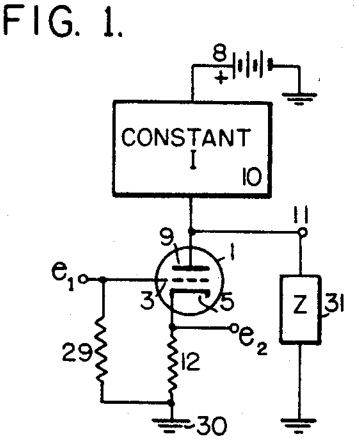

My invention relates to an amplifier that is effective down to zero frequency and is characterized by a high degree of fidelity of reproduction of an input signal and by a high degree of constancy of the amplitude of such reproduction.

While amplifiers employing negative feedback with vacuum tubes or transistors have been practical devices for many years the stability required of certain electronic apparatus in this day cannot be supplied by known embodiments of such devices. For example, in calibrating a digital-indicating voltmeter having four or five integers, an amplifier with an amplitude stability of 0.01% is required in combination with a similarly stable signal source. Unless this is obtained the last decimal place on the voltmeter will flutter between two values. If the operator is attempting to measure 10.000 volts, say, this might mean recycling of the whole register between 9.999 and 10.000, under which conditions calibration is inconvenient.

I have evolved amplifier circuits having stable amplification without the use of feedback. Such circuits are invaluable in applications where negative feedback cannot be used, as in bridge oscillators. Also, where negative feedback can be used, my amplifiers give an additional order of stability; i.e., they are ten times more stable.

The gain of known amplifiers has invariably been affected by the life cycle of the vacuum tubes employed, or by variation of almost any of the components employed in the device.

I am able to overcome both of these shortcomings by providing a novel circuit in which the amplification of the amplifier is determined solely by an invariable parameter of a vacuum tube; its amplification factor.

The crowding of the family of grid voltage curves in the plate-voltage plate-current characteristic for values of low plate current for a vacuum tube is well known. This, of course, results in distortion. While such distortion can be minimized by feedback, this means cannot always be employed, as has been mentioned.

I am able to avoid this region of distortion by employing a network that gives essentially infinite impedance for the plate circuit load. The load line upon the characteristic just mentioned is then horizontal. A number of known vacuum tubes have very precisely equal increments of plate voltage between equal increments of grid voltage for such a load line. Thus, feedback is not required in my circuit for an exemplary degree of linearity; or, if used, a very high degree of linearity is obtained.

This aspect of my invention results from the use of a constant current source in the plate circuit of a vacuum tube if the amplifier be single-ended and there and also in the cathode circuit of the amplifier be of the differential type. A constant current source has, in effect, an infinite impedance. I embody such a source in the form of a single active element, such as a transistor or in the form of an additional vacuum tube.

An object of my invention is to provide a highly stable and highly linear electrical amplifier.

Another object is to provide such an amplifier devoid of feedback loops.

Another object is to provide an amplifier having a high impedance differential input.

Another object is to provide an amplifier which has a gain dependent only upon a structural parameter of a vacuum tube.

Another object is to provide a relatively simple and inexpensive amplifier which operates at nominal supply voltages.

Other objects will become apparent upon reading the following detailed specification and upon examining the accompanying drawings, in which are set forth by way of illustration and example certain embodiments of my invention.

Figure 3:
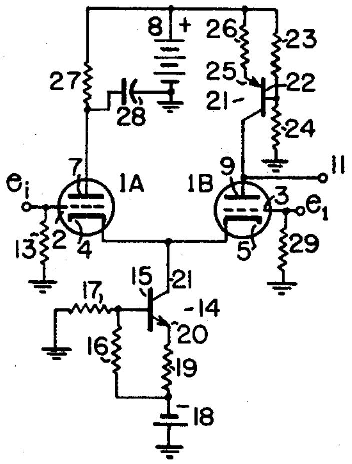
Figure 2:
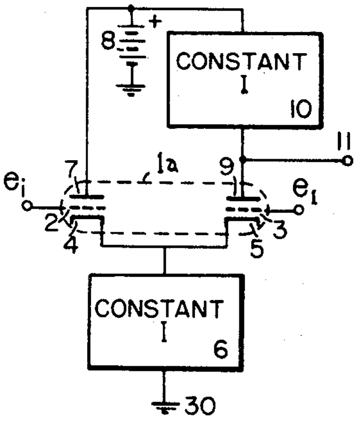
Figure 5:
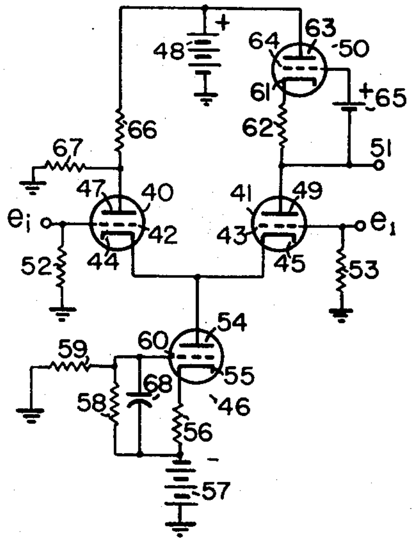
Figure 4:
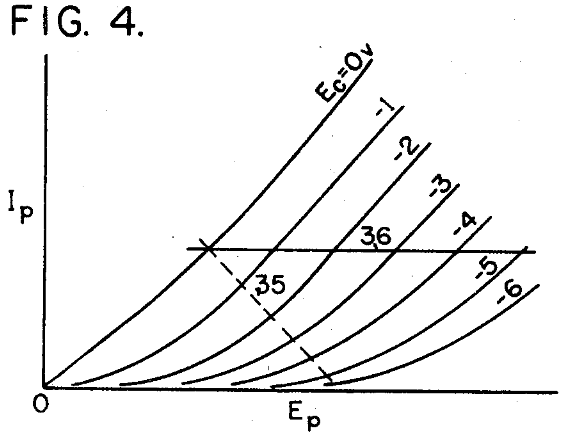

FIG. 1 shows a single-ended embodiment of my amplifier with a generically indicated constant current generator, FIG. 2 shows a differential embodiment of my amplifier with generically indicated constant current generators, FIG. 3 shows the same with transistors employed to form constant current generators, FIG. 4 shows a plate-current plate-voltage plot for a vacuum tube and an illustrative load line according to my invention, and FIG. 5 shows a differential embodiment of my amplifier with vacuum tubes employed to form constant current generators.

In FIG. 1, numeral 1 represents a vacuum tube, typically of the triode type. This is preferably of the medium (30) to high (100) mu type having a frame grid construction, such as the 6CM4 or one-half of a 6DJ8 type.

The input signal $e_1$ is normally applied between grid 3 and signal ground 30, but may also be applied as $e_2$ between cathode 5 and the signal ground. Signal ground 30 may be an actual ground, or common circuit return, as it has been shown schematically; or it may be a point of fixed potential with respect to the input signal when this is an alternating potential, as can be established by a bypass capacitor.

Cathode 5 is connected to the signal ground through resistive impedance 12, which provides the desired cathode bias. Resistor 29 provides a return path for grid 3 to signal ground. Plate 9 is connected to constant current source 10, which in turn is connected to plate energizing potential source 8. Output terminal 11 is the means by which the output signal is taken from plate 9; constant current source 10 acting as the load impedance.

Since the output of my amplifier appears across an effectively infinite impedance, an external impedance, such as 31, that is connected to terminal 11 and signal ground, must also have effectively infinite impedance lest the loading of the external circuit reduce the performance of the amplifier. Consequently, the external impedance 31 should consist of the grid of a vacuum tube, such as a cathode follower, the gate of a field effect transistor, etc. Since an "infinite" plate load of 100 to 1,000 times the plate impedance of the tube 1 is satisfactory, a commensurate impedance 31 is satisfactory if it is in the megohm range.

Considering my amplifier analytically, the voltage amplification A of a single conventional vacuum tube stage $$A=\frac{\mu\ R_L}{R_L+R_p} \qquad (1)$$

wherein:

$\mu$=amplification factor of vacuum Tube 1
$R_L$=load impedance
$R_p$=internal plate impedance of the vacuum tube In the present instance the plate load impedance for the triode 3, 5, 9 of FIG. 1 is essentially infinite, since the current which flows in a constant current source, as 10, is independent of the voltage impressed across it. Thus, the term $R_p$ may be neglected and so we have for a signal $e_1$ impressed upon the grid:

$$A=\mu\frac{R_L}{R_L}=\mu \qquad (2)$$

For a signal $e_2$ impressed upon the cathode, this is:

$$A=(\mu+1)\frac{R_L}{R_L}=\mu+1 \qquad (3)$$

The amplification factor $\mu$ of a vacuum tube is dependent only upon its physical structure; mainly, the distance of the grid from the cathode and from the plate and the is the well known expression: fineness of the mesh of grid wires (i.e., the closeness of spacing of one grid wire to the next, which influences the flow of the electron stream from the cathode to the plate).

It is immediately evident that I have achieved a great independence from the plural operating parameters which heretofore have affected the gain of an amplifier. One such parameter is mutual conductance, which is the quotient of the amplification factor over the plate impedance. The plate impedance is affected by such operating factors as plate voltage, cathode heater voltage, emissivity of the cathode and by residual factors within the vacuum tube throughout its life. Thus, the performance of my amplifier is essentially independent of the life cycle of the vacuum tube, its operating voltages and certain parameters.

In FIG. 2, numeral 1*a* represents a pair of vacuum tubes. These may be in a single vacuum envelope, as the known dual or twin triodes, of which the 6DJ8 tube is an example. In a typical application of the invention, grids 2 and 3 are provided with differentially-related components of an input signal from a known source not shown. Cathodes 4 and 5 are connected together inside or outside of the tube and the common connection is connected to first constant current source 6. This, in turn, is connected to signal ground 30. Plate 7 is connected to a source of positive energizing potential 8. Plate 9, coactive with grid 3 and cathode 5, is connected to second constant current source 10. This, in turn, is connected to energizing potential source 8.

In numerous applications of the amplifier I prefer to introduce the signal upon one grid, as grid 2, as signal $e_1$, and to obtain a first input type of "differential" operation. This is accomplished by the provision of constant current source 6, which is characterized as the first such source for identification. In this type of operation the second input signal is zero.

Source 6 provides essentially infinite impedance in the common circuit of cathodes 4 and 5. This impedance is very large with respect to an ordinary load impedance in a plate circuit. Additionally, it is desirable and possible to select tube 1*a* with two sets of electrodes 2, 4, 7 and 3, 5, 9 having the same amplification factor $\mu$. Under these conditions very good differential amplifier functioning is obtained. This contemplates the introduction of two differentially related signals, one upon grid 2, ($e_1$), and one upon grid 3, ($e_1$); i.e., the usual type of differential operation. The amplifier is responsive only to the difference of the two signals and the common mode rejection is high. The latter means, of course, that any signal introduced to both grids 2 and 3 in the same phase is not amplified.

In order to note the difference between my amplifier and that of the prior art, please consider the following. In the type of differential operation treated directly above the amplification obtained at terminal 11 in FIG. 2 of a signal $e_1$ introduced upon grid 2 would be only half that defined by Equation 1 for the nominal value of cathode impedance of the prior art. This occurs because the section of the tube 2, 4, 7 acts as a cathode follower, driving the cathode of section 3, 5, 9 as a grounded grid stage. In looking back into each cathode circuit the impedances are equal. With source and receiver impedances equal the well known loss of one-half, or 6 db, is experienced.

With my relatively infinite impedance 6 in the common cathode circuit, section 2, 4, 7 acts as a cathode follower with a near infinite impedance load and thus provides an amplification that is very nearly equal to:

$$A'=\frac{\mu}{\mu+1} \qquad (4)$$

This is derived as follows:
The known feedback equation is:

$$A'=\frac{A}{1+AB} \qquad (5)$$

where:
$A'$=voltage amplification of feedback stage
$A$=voltage amplification of usual stage
$B$=feedback factor; for a cathode follower will be unity because of total feedback substituting the value of A, as given in Equation 1 in Equation 5.

$$A'=\frac{\mu R_L/(R_L+R_p)}{1+(\mu R_L/(R_L+R_p)1} \qquad (6)$$

When $R_L$ is infinite, which in practice can be taken as a value of 10 megohms, Equation 6 is seen to immediately simplify to Equation 4.

Considering Equation 4 with values of $\mu$ in the range of 30 to 100, as recommended for the vacuum tubes for my amplifier, it is seen that the amplification A′ is very nearly unity. For a $\mu$ of 100, the amplification would be only 1% less than unity.

Also, the cathode input impedance of section 3, 5, 9 is very high because of the near infinite plate load impedance provided by constant current generator 10. This imposes no appreciable shunting effect on section 2, 4, 7.

The numerical value of the cathode impedance $Z_k$, looking into cathode 5 and ground, which is in shunt to the impedance of constant current source 6 as a load for section 2, 4, 7 is:

$$Z_k=\frac{R_p+R_L}{\mu+1} \qquad (7)$$

in which all terms have previously been defined. Since $R_L$ is nearly infinite, so is $Z_k$ from Equation 7.

The amplification of input signal $e_1$ is equal to the product of the gains of both sections of tube 1*a*. The gain of the first section was given by Equation 4 and of the second section by Equation 3. Forming this product to give the amplification $A_{e_1}$, we have:

$$A_{e_1}=\frac{\mu}{(\mu+1)}\; x^{(\mu+1)=\mu} \qquad (8)$$

(The same binomial in numerator and denominator cancels out.)

The amplification of input signal $e_1$ is also=$\mu$, from Equation 2. Thus, equal differential amplification is provided both input signals $e_1$ and $e_1$ by my amplifier stage of FIG. 2.

The above discussions indicate how constancy of amplification is maximized in my amplifier. We now turn to a consideration of its linearity, or fidelity of amplification.

FIG. 4 shows the known plate-voltage plate-current characteristic for a triode vacuum tube such as 1 in FIG. 1, or either of the triode sections of dual tube 1*a* in FIG. 2. As is known, the curves for the several grid voltages, $E_c$, run together at low values of plate current. Dotted line 35 indicates a typical load line of the prior art. This gives the correlation between the grid and plate voltages and the plate current for a given conventional load impedance $R_L$. It is seen that the increment of plate voltage or of plate current for an increment of grid potential of from −4 to −5 volts is only about half that for the increment from 0 to −1 volt. This, of course, indicates serious distortion for any signal waveform that extends from a grid potential of from approximately 0 to −5 volts.

When constant current source 10 of FIG. 1 is employed, it is seen that the load line in FIG. 4 would be horizontal; i.e., line 36. This is because the plate current $I_p$ is constant, regardless of the value of the plate voltage $E_p$. Now, the increments of plate voltage for equal increments of grid voltage are all very nearly or exactly equal. Thus, the fidelity of amplification has been very greatly improved; it approaches perfection.

With constant current source 6 in the cathode circuit of FIG. 2 it is seen that the fidelity of the first section of twin tube *1a*, section 2, 4, 7, is also very nearly perfect. This section functions as a cathode follower for the signal impressed upon grid 2; i.e., signal $e_1$. With the substantially infinite cathode impedance the known self negative feedback of a cathode follower approaches 100%, giving substantially perfect fidelity. The distortion is reduced by $1/\mu$ times the distortion present in a grounded cathode stage.

Thus, both sections of tube *1a* operate with excellent fidelity.

A typical practical circuit for accomplishing the performance set forth in connection with FIGS. 1 or 2 is shown in FIG. 3. By noting the reference numerals employed in FIGS. 1 and 2 it is seen that the single vacuum tube of FIG. 1 corresponds to the right-hand triode of tube *1a* of FIG. 2. Similarly, in the practical circuits of FIGS. 3 and 5 the right-hand tube of each corresponds to the single tube showing of FIG. 1.

In FIG. 3, the basic vacuum tube structure is shown as two separate triodes 1A and 1B. These preferably have identical characteristics, but it is immaterial whether or not both are housed in one vacuum envelope. Signal $e_1$ is introduced to grid 2 as before. Grid return resistor 13 provides a path to ground to establish a fixed grid potential around which the signal $e_1$ may vary. Constant current source is comprised of transistor 14 and this may be of the NPN type.

A transistor constitutes a constant current device in that the collector current is relatively independent of the collector voltage. This characteristic is enhanced by adding resistance in the emitter circuit; i.e., resistor 19 in FIG. 3. A suitable resistance value for this resistor is of the order of 500 ohms.

A proper bias is placed on base 15 of transistor 14 by the voltage divider composed of resistors 16 and 17, the junction between which is connected to the base. The other terminal of resistor 16 connects to a source of supply voltage 18. The latter provides a voltage negative with respect to ground, which voltage may be of the order of 11 volts. A fraction of this voltage is applied to base 15. Through resistor 19 the whole of the voltage of source 18 is applied to emitter 20 of transistor 14. Collector 21 thereof is connected directly to both cathodes 4 and 5 of vacuum tubes 1A and 1B. In a typical embodiment the elements of transistor 21 circuit are adjusted to give a constant current of 10 milliamperes.

Additional constant current source 10 is largely embodied in transistor 21. For convenience in supplying energizing voltages this transistor is of the PNP type. Base 22 thereof is provided with a proper bias, as 70 volts positive with respect to ground, by the voltage divider comprised of resistor 23 in series with resistor 24. These resistors are connected between a source of voltage supply, represented by battery 8, and ground. The junction between the two resistors is connected to base 22.

A preferred voltage for battery 8 is 75 volts. The ratio of the resistance of resistor 24 to the resistance of resistor 23 determines the percentage of the supply voltage appearing across resistor 26. This is preferably 5 to 10 times the base to emitter drop for transistor 21, to minimize the effect of temperature upon the constancy of the constant current function. Emitter 25 is connected to the positive terminal of battery 8 through resistor 26. This resistor has a resistance value selected to provide the desired constant current flow. The resistance value is usually less than that of resistor 23. In a typical embodiment the elements of transistor 21 circuit are adjusted to give a constant current of 5 milliamperes through vacuum tube section 1B.

Vacuum tube 1A is also energized from voltage source 8 through resistor 27, which has a value to cause the plate voltage of tube 1A to be the same as the plate voltage of tube 1B. This arrangement consumes the total of 10 milliamperes passed by the cathode constant current source comprising transistor 14. The voltages at each of plates 7 and 9 are equal under these conditions, at a value of the order of 55 volts.

Where no use is made of the signal from plate 7 a bypass capacitor 28 is connected therefrom to ground. Such a capacitor is to be in the microfarad range and it is effective in reducing power supply ripple, that is, when battery 8 is replaced by the usual power supply in practice. If only an alternating current signal is carried by the amplifier capacitor 28 is effective in the usual bypass function, but for direct current amplification it is not effective. Similar capacitors may be placed across resistor 16 and across resistor 23 to achieve similar results.

The circuit of FIG. 5 follows the circuits of FIGS. 2 and 3, but employs vacuum tubes throughout. The twin differential amplifier tubes 40 and 41 are as *1a* and 1A and 1B before. Grids 42 and 43 are provided with differentially originated components of signal, as has been discussed. Grid return circuits 52 and 53 are represented by resistors connected to signal ground and may be either of this form or the equivalent in paths through coupling apparatus employed to feed the desired signals to the amplifier. Cathodes 44 and 45 are made common by a connection and this is connected to the plate electrode 54 of a constant current source generally represented by numeral 46.

Cathode 55 of the constant current source tube 46 is connected through cathode resistor 56 to a source of negative supply voltage 57, which source may have a voltage of the order of −150 volts. Resistors 58 and 59, also connected in series from the negative terminal of source 57 to ground, form a voltage divider to impress a potential of the order of −100 volts upon grid 60. The drop due to the constant current in this circuit causes cathode 55 to assume a potential more positive than that of grid 60 by the amount of the desired grid bias, typically 1.25 to 3 volts. As before, the bias on grid 60 is set to provide a constant current flow sufficient for the cathode to plate current of both tubes 40 and 41. Circuit 46 takes the place of constant current source 6 in FIG. 2. A bypass capacitor 68 may be employed across resitsor 58 to reduce power supply ripple, etc., as was mentioned in connection with resistors 16 and 23 of FIG. 3.

The place of constant current source 10 in FIG. 2 is taken by the tube and circuit 50 in FIG. 4. Cathode electrode 61 thereof is connected to plate 49 of main tube 41 through cathode resistor 62. Plate electrode 63 is connected to the positive terminal of voltage supply 48, which supply may have a voltage of the order of 200 volts in a representative embodiment. Grid 64 is given a positive potential by battery 65 in the same manner as was provided by voltage divider 58, 59 in the cathode constant current source 46. However, a "floating" battery is required for grid 64, since one terminal of the battery must be attached to output signal terminal 51. The battery may be of the small bias cell type in order to have low stray capacitance to ground. A voltage of the order of 50 volts is typically required. As before, the voltage drop in cathode resistor 62 brings the cathode potential 1.5 to 3 volts positive with respect to the grid for usual vacuum tubes suited for my amplifier.

The current passed by constant current source 50 is half that passed by source 46. The potential at plate 49 is of the order of +50 volts and at grid electrode 64 it is +100 volts. The current and voltage for vacuum tube 40 is balanced with respect to that of vacuum tube 41 by voltage divider 66, 67; this being connected in series between battery 48 and ground. The junction point between resistors 66 and 67 is connected to plate 47; this plate being held at approximately 50 volts (for no DC signal).

In addition to the use of my amplifier as an amplifier per se it will be understood that it may be incorporated as the amplifying part of related devices, such as bridge oscillators. It may also be made a part of multistage power amplifiers. In any such embodiments its superior characteristics have been found to signficantly improve the overall characteristics of the whole apparatus.

Although specific examples of voltages, graphs and values for the several circuit elements have been given in this specification to illustrate the invention, it is to be understood that these are by way of example only and that reasonably wide departures can be taken therefrom without departing from the inventive concept. Other modifications of the circuit elements, details of circuit connections and alteration of the coactive relation between elements may be taken under my invention.

Having thus fully described my invention and the manner in which it is to be practiced, I claim:

1. A direct current amplifier in which the amplification of the signal is substantially completely determined by the amplification factor of each section of a dual vacuum tube comprising;

(a) a dual triode vacuum tube structure, each of the triodes having a grid, a plate, and a cathode in common, (b) only a single constant current source connected between said common cathode and signal ground, (c) means connected to said two grids for differentially impressing a signal to be amplified upon said grids, (d) a second constant current source, (e) a connection from said second constant current source to only one of said two plates and to a signal ground, (f) a conductor solely connecting the other of said two plates to said signal ground, and (g) means having an impedance commensurate with that of said second constant current source connected to the same one of said two plates to obtain the amplified signal.

2. The direct current amplifier of claim 1 in which;

(a) the first said constant current source includes an NPN transistor, and (b) means to directly connect said NPN transistor to said common cathode; and (c) the second said constant current source includes a PNP transistor; and (d) means to connect said PNP transistor to said only one of said two plates.

3. The direct current amplifier of claim 1 in which the first said constant current source includes;

(a) a transistor having emitter, base and collector electrodes, (b) means to fix the potential of said base electrode connected thereto, (c) means to directly connect said collector electrode to said common cathode, (d) a resistive impedance having a value to cause the first said constant current source to pass two units of current, (e) means to connect said emitter electrode to said resistive impedance, and (f) means to connect said resistive impedance to a signal ground.

4. The direct current amplifier of claim 1 in which the second said constant current source includes;

(a) a transistor having emitter, base and collector electrodes, (b) means to fix the potential of said base electrode connected thereto, (c) means to connect said collector electrode to said only one of said two plates, (d) a resistive impedance having a value to cause the second said constant current source to pass one unit of current, said resistive impedance connected to a source of energizing potential for said one of said two plates, and (e) means to connect said emitter electrode to said resistive impedance.

5. The direct current amplifier of claim 1 in which the first said constant current source includes;

(a) only a third vacuum tube having third cathode, grid and plate electrodes, (b) means to fixedly bias said third grid electrode connected thereto, (c) means to connect said third plate electrode directly to said common cathode, (d) a resistive impedance, (e) means to connect said third cathode electrode only to said resistive impedance, and (f) means to connect said resistive impedance to a signal ground having a source of negative supply voltage.

6. The direct current amplifier of claim 1 in which the second said constant current source includes;

(a) a fourth vacuum tube having fourth cathode, grid and plate electrodes, (b) single means to fixedly bias said fourth grid electrode directly connected thereto, (c) a resistive impedance, (d) means to connect said resistive impedance to said only one of said two plates and to said fourth cathode electrode, and (e) means to connect said fourth plate electrode to a source of energizing potential for said only one of said two plates.

7. The direct current amplifier of claim 1 in which;

(a) said dual vacuum tube structure is comprised of two separate vacuum tubes, and (b) said common cathode is formed by directly connecting the cathodes of said two separate vacuum tubes.

References Cited

UNITED STATES PATENTS

| | | | |
|---|---|---|---|
| 2,762,010 | 9/1956 | Rose et al. | |
| 2,897,429 | 7/1959 | Jochems. | |
| 2,941,155 | 6/1960 | Lucas | 330—69 |
| 3,178,651 | 4/1965 | Kegelman | 330—18 X |

FOREIGN PATENTS

| | | |
|---|---|---|
| 816,664 | 7/1959 | Great Britain. |

OTHER REFERENCES

Text Book, Valley and Wallman, "Vacuum Tube Amplifiers," sections 11–8 and 11–9 (pp. 432–440).

ROY LAKE, *Primary Examiner.*

NATHAN KAUFMAN, *Examiner.*